United States Patent
King

(10) Patent No.: US 9,842,633 B2
(45) Date of Patent: Dec. 12, 2017

(54) TRACKING AND CORRECTION OF TIMING SIGNALS

(71) Applicant: Micron Technology, Inc., Boise, ID (US)

(72) Inventor: Gregory A. King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/692,346

(22) Filed: Apr. 21, 2015

(65) Prior Publication Data

US 2016/0172017 A1    Jun. 16, 2016

Related U.S. Application Data

(60) Provisional application No. 62/090,815, filed on Dec. 11, 2014.

(51) Int. Cl.
*G11C 7/22* (2006.01)
*G11C 7/12* (2006.01)
*G06F 1/10* (2006.01)

(52) U.S. Cl.
CPC .................. *G11C 7/22* (2013.01); *G06F 1/10* (2013.01); *G11C 7/12* (2013.01); *G11C 7/222* (2013.01)

(58) Field of Classification Search
CPC .. G11C 7/22; G11C 7/12; G11C 7/222; G06F 1/10
USPC .................................................... 365/189.07
See application file for complete search history.

(56) References Cited

U.S. PATENT DOCUMENTS

| | | | | |
|---|---|---|---|---|
| 6,282,682 B1* | 8/2001 | Walker | ............ | G01R 31/31924 714/738 |
| 6,430,696 B1* | 8/2002 | Keeth | ................ | G06F 13/1689 345/522 |
| 6,952,123 B2* | 10/2005 | Kizer | ........................ | G06F 1/10 327/147 |
| 8,089,824 B2* | 1/2012 | Shaeffer | ............. | G06F 13/1689 365/191 |
| 8,320,202 B2* | 11/2012 | Ware | ........................ | G11C 5/04 365/191 |
| 2003/0179028 A1* | 9/2003 | Kizer | ........................ | G06F 1/10 327/158 |
| 2005/0242850 A1* | 11/2005 | Kawasaki | ........... | G06F 13/1689 327/155 |
| 2006/0044037 A1* | 3/2006 | Gomm | ................... | G11C 7/106 327/261 |

(Continued)

OTHER PUBLICATIONS

Baker (CMOS Circuit Design, Layout and Simulation, Third Edition, IEEE Press, 2010, Chapter 19).*

*Primary Examiner* — Anthan Tran
*Assistant Examiner* — Mushfique Siddique
(74) *Attorney, Agent, or Firm* — Schwegman Lundberg & Woessner, P.A.

(57) ABSTRACT

Various embodiments include apparatus and methods to track and/or correct timing signals. Timing signals generated from an interface can be compared to the timing signals returned to the interface. A timing delta from the comparison can be applied to calculate a correction value make adjustments that can include adjustment to a subsequent timing signal, adjustment to a reference voltage setting associated with the subsequent timing signal, other adjustments, or combinations thereof. Additional apparatus, systems, and methods are disclosed.

18 Claims, 6 Drawing Sheets

(56) References Cited

U.S. PATENT DOCUMENTS

| | | | |
|---|---|---|---|
| 2007/0174586 A1* | 7/2007 | Tell | G06F 1/10 712/1 |
| 2009/0180341 A1* | 7/2009 | Ide | H03K 5/15066 365/203 |
| 2010/0085099 A1* | 4/2010 | Ma | G06F 1/06 327/295 |
| 2010/0091537 A1* | 4/2010 | Best | G11C 5/02 365/51 |
| 2010/0103746 A1* | 4/2010 | Ma | G11C 7/1066 365/189.05 |
| 2010/0135100 A1* | 6/2010 | Chiu | G11C 7/1072 365/233.11 |
| 2011/0050303 A1* | 3/2011 | Ma | G11C 7/222 327/158 |
| 2011/0208990 A1* | 8/2011 | Zerbe | G06F 1/08 713/501 |
| 2013/0148447 A1* | 6/2013 | Shaeffer | G11C 5/14 365/189.17 |
| 2014/0192583 A1* | 7/2014 | Rajan | G11C 7/10 365/63 |

* cited by examiner

TRACKING AND CORRECTION OF TIMING SIGNALS

PRIORITY APPLICATION

This application claims the benefit of priority to U.S. Provisional Application Ser. No. 62/090,815, filed Dec. 11, 2014, which is incorporated herein by reference in its entirety.

BACKGROUND

The electronics industry is under constant pressure to both reduce component size as well as power requirements. One approach to reduce component size is to fabricate devices in a three-dimensional (3D) configuration. For example, a memory device can be arranged as a stack of memory cells vertically on a substrate, as a plurality of interconnected memory dies stacked vertically within a single integrated circuit package, or some combination of these configurations.

Multiple stacked dies in an integrated package can be coupled (e.g., electrically connected) using vertical connectors, such as through substrate vias or other 3D conductive structures. Vias extend (at least partially) through a thickness of one or more of the dies and can be aligned when the dies are stacked, thus providing electrical communication among the dies in the stack. Such vias are often formed of a conductive material, such as aluminum or copper. Improvements in timing signal precision can be useful as device speeds and density increase.

DETAILED DESCRIPTION

The following detailed description refers to the accompanying drawings that show, by way of illustration and not limitation, various embodiments in which the invention may be practiced. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, apparatus and methods to track and/or correct timing signals can be implemented for timing signals transmitted across an interface between dies with independent voltage domains. Timing signals generated from an interface can be compared to the timing signals returned to the interface. A timing delta from the comparison can be applied to calculate a correction value to make adjustments that can include adjustment to a subsequent timing signal, adjustment to a reference voltage setting associated with the timing signal, other adjustments, or combinations thereof.

Figure 1:
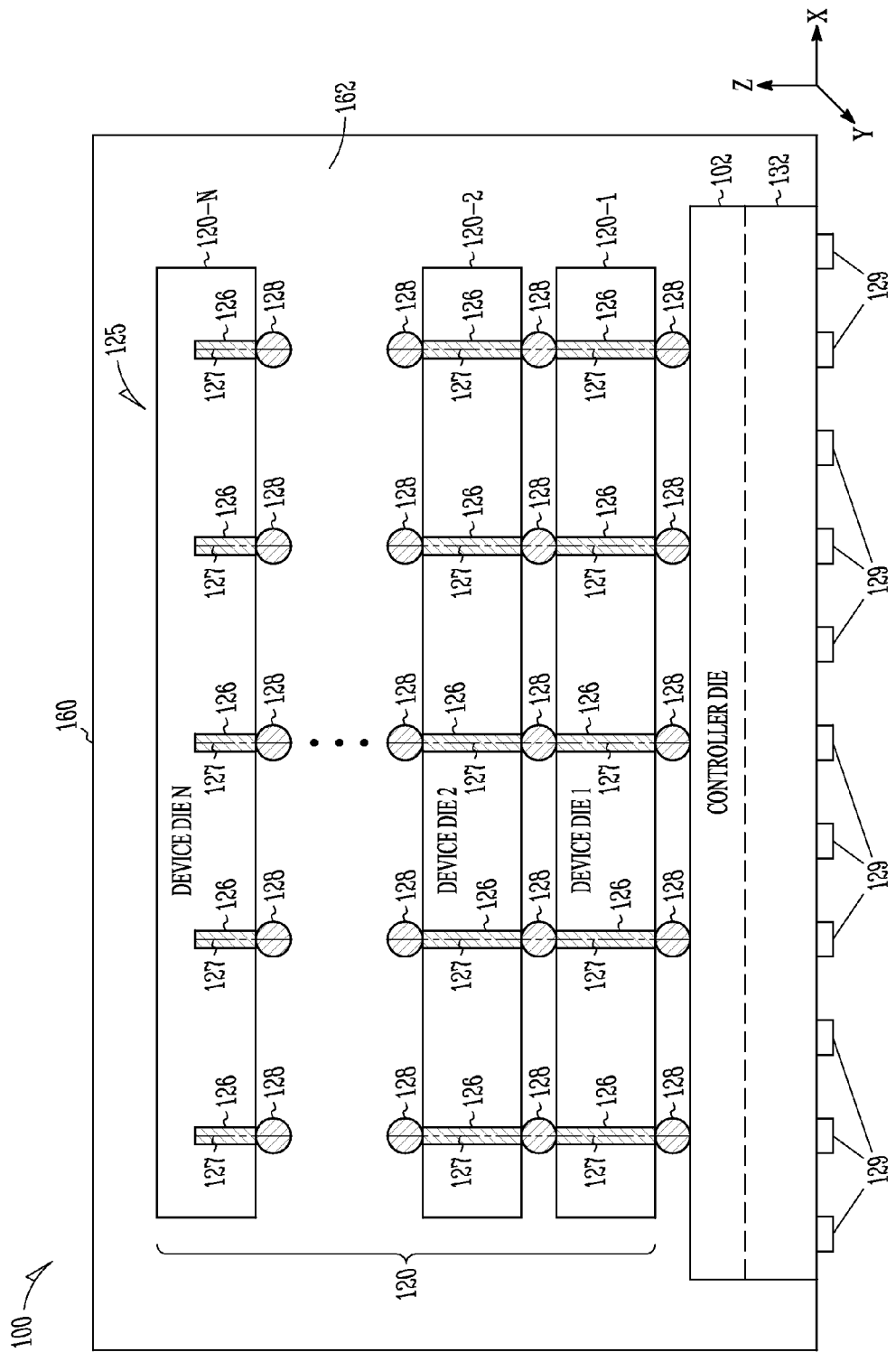
FIG. 1 is a representation of a three-dimensional integrated structure that can implement a combination of a controller die and an electronic device structure, according to various embodiments.

FIG. 1 is a representation of an example embodiment of a 3D integrated structure that can implement the combination of a controller die 102 and an electronic device structure 120. Controller die 102 can include circuitry to control access to and from individual dies of electronic device structure 120. Note, a die is often referred to as a chip. Electronic device structure 120 includes a number of device dies 120-1, 120-2 . . . 120-N arranged in a stack 125 disposed on controller die 102. Device dies 120-1, 120-2 . . . 120-N may include, but are not limited to, a number of application specific integrated circuits, a number of memory devices, a number of processing devices, a number of communication-related devices, and combinations thereof. Communication among device dies 120-1, 120-2 . . . 120-N can include a clock signal, also referred to as clock, and/or a strobe signal, where a strobe signal, as used herein, is a signal to aid in synchronization behind two dies. A clock in a device runs continuously while the device operates and a strobe runs as a clock-like pattern that starts and stops, that is, the strobe is activated and terminates until another activation.

Signal conductivity in stack 125 can be provided by through-substrate vias (TSVs) 126, containing conductive material 127, that extend from one surface of the substrate of a die to the opposite surface. In a silicon substrate or a silicon-based substrate, these through-substrate vias are referred to as through-silicon vias. Through-substrate vias 126 of one device die may be communicatively coupled to through-substrate vias 126 of another device die using conductive joints 128 formed pair-wise between device dies 120-1, 120-2 . . . 120-N. Joints 128 may include solder, copper, or a conductive adhesive. Joints 128 may also be used to contact electronic device structure 120 to controller die 102. Stack 125 may be formed using techniques such as "flip-die" or other techniques. With the 3D integration realized as a number of device dies disposed on a controller die forming a stack, through-substrate vias interconnect the device dies and the controller die in the z-direction. These through-substrate vias 126 allow implementation of transmission paths that can be implemented with these device dies 120-1, 120-2 . . . 120-N and controller die 102 with equivalent transmission capabilities as if arranged on the same horizontal plane. Through-substrate vias 126, containing conductive material 127, can be arranged to provide, depending on the application of such a 3D integration, various combinations of data buses, address buses, control lines, and other communication paths.

Stack 125 can be constructed in an IC package 100 including contacts 129 that provide the electrical conductivity to couple controller die 102 and electronic device structure 120 to other application specific devices such as, but not limited to, host processors, maintenance apparatus, input/output devices, communication interfaces, various system buses, and other system components. Contacts 129 may provide for direct coupling to other application specific devices or for coupling to other application specific devices by system buses. Contacts 129 may be connected to a support 132 on which controller die 102 may be disposed, with communication to controller die 102 provided by TSVs in support 132 or by other communication paths. Support 132 may include a semiconductor package substrate, a ceramic package substrate, an organic package substrate, or other package substrate appropriate for the configuration of stack 125.

In addition to contacts 129 for interfacing with external applications, IC package 100 may include an enclosure 160 having an interior 162 between the components of stack 125 and enclosure 160. Interior 162 may be filled with a filling material, a gas, a liquid, or a combination thereof. The filling material may include a polymer material.

In various embodiments, controller die 102 may be formed on top of electronic device structure 120. In such an inverted orientation relative to FIG. 1, contacts 129 can be formed coupled to controller die 102 to provide communication with system and/or system devices external to IC package 100. With the components of IC package arranged in a bonded fashion as illustrated and discussed above with filling material used in interior 162 of enclosure 160, IC package 100 is not limited to mounting in a particular orientation. Other configurations for coupling electronic device structure 120 and controller die 102 may be realized such that controller die 102 is not limited to being arranged in stack 125 with electronic device structure 120.

Figure 2:
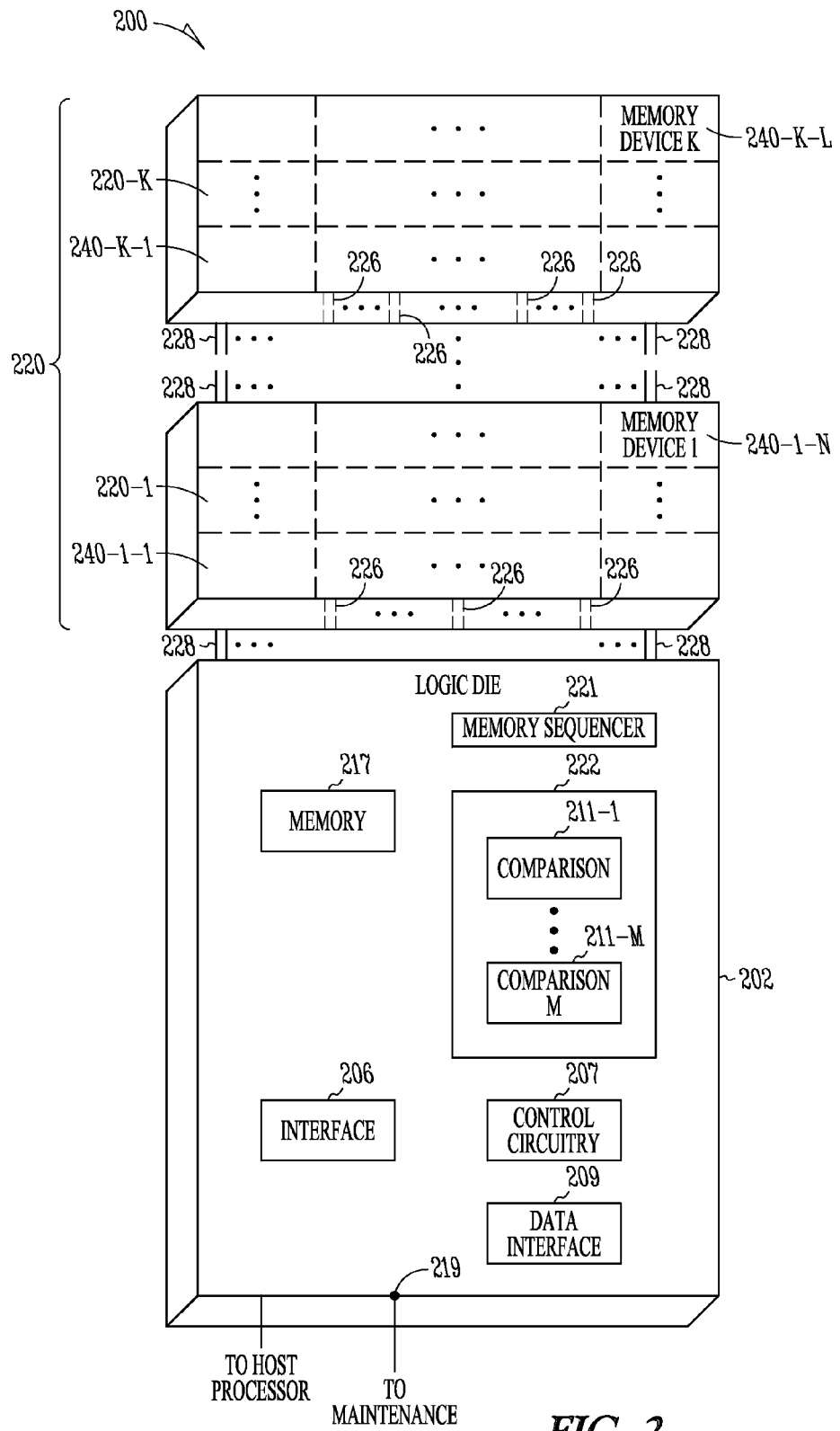
FIG. 2 is a representation of an example apparatus including a stack of memory devices and a logic die coupled to the stack, according to various embodiments.

FIG. 2 is a representation of an embodiment of an apparatus including a stack 220 of memory devices 220-1 . . . 220-K and a logic die 202 coupled to stack 220. Logic die 202 can be configured to manage the operation of stack 220 of memory devices 220-1 . . . 220-K. Logic die 202 can be configured to operate similar to or identical to controller die 102 with logic die 202 further structured to control access to and from memory dies. Stack 220 of memory devices 220-1 . . . 220-K and logic die 202 coupled to stack 220 can be configured as a hybrid memory cube (HMC). A HMC is a single package containing multiple memory dies and a logic die, stacked together using TSV technology.

Memory systems may be designed to operate with a multi-core processor as a host processor. A multi-core processor has a number of cores in which each core has a computing element and a router that provides for processing data individually and for transporting that data to neighboring cores. With multi-core processors, having 80, 100, or 200 cores, spatial considerations and bandwidth considerations for a memory system increase the impact of memory system design. Indeed, memory data transport capability may influence ultimate system processing efficiency more than microprocessor clock rates.

Stack 220 of memory devices 220-1 . . . 220-K can be located beside a host processor with logic die 202 underneath stack 220 of memory devices 220-1 . . . 220-K, where logic die 202 interfaces to memory devices 220-1 . . . 220-K, accesses data from stack 202, and translates the accessed data to a high speed interconnect. In addition, with logic die 202 configured to manage operation of stack 220 of memory devices 220-1 . . . 220-K, the host processor can be relieved of such management tasks.

Logic die 202 may include control circuitry 207 to manage stack 220, an interface 206 to couple logic die 202 to a host processor, a data interface 209 to direct transmission of data to and from stack 220 in response to commands from the host processor, and control circuitry 207. Logic die 202 can include a memory sequencer 221 to direct transmission of data to and from the stack of memory devices in response to commands from a host processor. Memory sequencer 221 and/or control circuitry 207 can also manage the storage and retrieval of data from the memory locations distributed in memory devices 220-2 . . . 220-K. Sequencing instructions may also be stored in memory 217.

In various embodiments, logic die 202 may be programmed via a maintenance interface port 219. Such programming can include storing the instructions in memory 217. Maintenance interface port 219 may be configured to be compatible as a JTAG (Joint Test Action Group) interface port.

Apparatus 200 may be coupled with a host processor to perform a number of applications as part of a larger device or system. In an example arrangement, as illustrated in FIG. 2, logic die 202 can manage operation of stack 220 such that a host processor is relieved of the direct interaction with stack 220.

Memory 217 can be loaded with various data and algorithms at various times, including the boot time of logic die 202-electronic device structure 220 in an apparatus. The various different algorithms may be performed autonomously by logic die 202. Such algorithms can include procedures to make corrections to timing signals based on measured timing differences using comparison circuitry 411-1 . . . 411-M.

Logic die 202 and stack 220 may be coupled in a manner similar to or identical to that illustrated with respect to FIG. 1. Signal conductivity in stack 220 can be provided by TSVs 226, containing conductive material, that extend from one surface of the substrate of a die to the opposite surface. Through-substrate vias 226 of one memory device may be communicatively coupled to through-substrate vias 226 of another memory device die using conductive joints 228 formed pair-wise between memory devices 220-1, 220-2 . . . 220-K. Joints 228 may include solder, copper, or a conductive adhesive. Joints 228 may also be used to connect stack 220 to logic die 202. Stack 220 may be formed using techniques such as "flip-die" or other techniques. With the 3D integration realized as a number of memory devices disposed on a logic die forming a stack, through-substrate vias interconnect the memory devices and the logic die in the z-direction. These through-substrate vias 226 allow implementation of transmission paths that can be implemented with these device dies 220-1, 220-2 . . . 220-K and logic die 202 with equivalent transmission capabilities as if arranged on the same horizontal plane. TSVs 226, containing conductive material, can be arranged to provide, depending on the application of such a 3D integration, various combinations of data buses, address buses, control lines, and other communication paths.

In various embodiments, stack 202 of memory devices 220-1, 220-2 . . . 220-K can be arranged as a plurality of horizontal levels in the vertical stack such that each memory at a horizontal level is partitioned on each horizontal level. Each of memory devices 220-1, 220-2 . . . and 220-K can be arranged as a plurality of logical partitions, a plurality of physical partitions in a single memory device, a plurality of memory devices with a different memory device for each partition, or combinations. In these partitions, each physical memory device may be configured as a single independent die. Partitions 240-1-1 . . . 240-1-N of memory device 220-1 may be different in number from the number of partitions in one or more of the other memory devices 220-2 . . . 220-K. For example, memory device 220-K may have partitions 240-K-1 . . . 240-K-L, where L is an integer different from N. Alternatively, L may equal N. In embodiment, L may equal N such that the number of partitions is the same for all memory devices 220-1 . . . 220-K. In an example, memory devices 220-2 . . . 220-K may be arranged with 16 XY partitions on a horizontal level for each vertical level (Z value) such that the set of XY partitions at each Z value form 16 different vertical slices. Each vertical slice may be referred to as a vault. Stack 220 is not limited to 16 vaults. The number of vaults of stack 220 may be greater than or less than 16. A vault arrangement may be constructed for other electronic device structures.

Logic device 202 can communicate with memory devices 240-1-1 . . . 240-1-N . . . 240-K-1 . . . 240-K-L concurrently, providing management of these devices and monitoring of the health of these devices. In various embodiments, stack 220 may be constructed with K=N=4 arranged as 4 horizontal levels with each level having 4 memory devices such that logic device 202 can communicate with these 16 memory devices concurrently. In various embodiments, concurrent management of the memory devices and monitoring of the health of these memory devices in stack 202 can be realized for K and N having values other than K=N=4.

Logic die 202 can provide memory management of data flow for stack 220 of parallelized memory devices, such as DRAM memory devices, using memory sequencer 221 and separating stack 220 from a high speed link. Signal conductivity in stack 220 realized by through-substrate vias 226 coupled to logic die 202 provides data pipes for the data flow to and from parallelized memory devices of stack 220. Logic die 202 creates an interconnect infrastructure to connect TSVs 226 with the memory devices in stack 220, whether in a partitioned arrangement or without such partitioning. The interconnect infrastructure may be arranged as a switching fabric.

With the management of data flow separated from the high speed link, stack 220 can be independent of changes to the high speed link and interface changes of processors coupled to the high speed link. In addition, control of stack 220 can be separated from a host processor to which stack 220 may be coupled to perform functions of applications in systems in which the host processor and stack 220 are inserted. Though a host processor directs flow of information in the system in which the host processor and stack 220, logic die 202 can be arranged to manage data flow to and from stack 220 as requested by the host processor.

In various embodiments, voltage induced timing shifts can be used to track and correct receiver duty cycle across interfaces with independent voltage domains. When a clock or strobe signal are to be transmitted between two dies with independent voltage domains, there are both timing shifts and duty cycle impacts when the voltages change independently on each side of the signaling interface. An example of a signaling interface where this is seen is a HMC memory interface, as voltages in the source and destination of the signaling interface change.

Measurements of timing shifts due to voltage changes, which are fairly straight forward to measure and track, can be conducted such that timing information can be used as a proxy of voltage change, which can be referred to as a voltage delta. This extracted voltage delta can be translated to duty cycle corrector, DCC, adjustments in a launch clock and/or receiver reference voltage, VREF, adjustments to avoid complicated and large DCC measurement blocks on a die.

It is also noted that to keep the lowest possible power in the interface design for the clocking and strobe generation circuits, a design can utilize an unterminated signal making the VOH (output voltage at the logic high state) full swing CMOS (complementary metal-oxide-semiconductor) level subject to the voltage level applied to the strobe circuits. This change in voltage on these full swing signals can result in duty cycle and timing shifts on the signals. Similar issues can exist in differential interfaces when translating between different voltage domains. Differential input/output, IO, can help reduce the VREF impacts, but duty cycle impacts can still occur. These impacts can be addressed with the methods and apparatus taught herein.

It is straightforward to measure the change in timing delay due to voltage changes on the clock trees and drivers for the strobe signals. A circuit using a fine grained phase detector or other timing measurement function can be used to measure relative clock delays. These measured delays can then be compensated by changing the appropriate codes in a programmable delay line and effectively track the low frequency/DC voltage changes out of the timing budget.

The independent voltage settings of each die interface can also influence the duty cycle of the clock and strobe trees. This duty cycle error may come from two primary sources. If the two dies that have a common interface operate at different and independently adjustable voltage domains, some form of level translation is required to translate the incoming clock signal from die one to the voltage domain used in die two. A method to accomplish this can include a comparator and VREF circuit when using high speed clocks requiring high fidelity. A second method to optimize a clock to a 50/50 duty cycle can include dedicated duty cycle adjustment circuits that are designed into the clock trees of both dies. The die that launches the strobe or clock signal can pre-skew the signal to compensate duty cycle errors in the receiving die.

Initially, when a die operation is started, a training routine can determine optimal delay timing, duty cycle setting, and VREF level for any voltage domain translations. These training values can be applied at the voltages used during the system boot up time. To maximize operating range and avoid many retraining updates, it is desirable to track as much of the voltage induced timing and duty cycle shifts that happen over operating time of the system between training updates. Conventionally, phase detector circuits can be used to monitor and track timing shifts due to low frequency voltage drifts. These detector circuits can be run intermittently to reduce power and make updates as required to keep the interfaces in an operating state. Circuits that measure duty cycle directly typically are fairly large and complicated as compared to timing phase detectors. However, in systems that are trained to a known good initial condition, it is possible use the voltage induced timing changes that are already being used to track timing shifts and use that information to infer an approximate voltage change.

In various embodiments, this approximate voltage shift data that is derived from the timing circuits can be used to apply a tracking adjustment to either or both the dedicated duty cycle control circuits to pre-skew the clock to correct for shifts or to adjust a VREF setting that may be utilized in any strobe receiver to maintain a more optimal clock sampling point in the clock receiver over operating voltage. The timing circuits can provide tracking of duty cycle changes across voltage and temperature shifts. Deviation of the time for a high signal and the time for a low signal may be considered duty cycle error. For a clock driver that uses a CMOS full level swing, the output amplitude will follow the die supply settings. This approach results in a shift of the common mode voltage point either up as supply increases or down as supply decreases. The processes, as taught herein, allow a tracking of this VREF offset to maximize operating range across voltage domains. Generally, the clock trees also have a predictable response to voltage increases or decreases of the applied die voltages. The inferred voltage shift information derived from the timing deltas can be used to adjust the programmable duty cycle control circuits to track this clock tree behavior resulting in a wider operating range of voltage.

In various embodiments, apparatus and methods can utilize a function derived through simulation, lab measurement, or during production test to determine a ratio of timing steps to VREF steps and duty cycle control steps. These values of step size information can be stored with a die, and firmware training routines in the die can include routines that can be used to validate these values over the life of the die. As timing update offsets increase or decrease, a controller die can apply a positive or negative VREF/duty cycle correction based on the timing to duty cycle ratio for a given interface.

Methods, as taught herein, can utilize existing timing delta information and can translate timing delta to a duty cycle correction code without requiring additional circuitry to directly measure duty cycle. An algorithmic based, two-cycle correction from a measured timing shift can be applied to timing signals between two or more dies. The algorithm can be stored in firmware or memory on a controller die, such as a logic die that manages memory dies. The firmware or memory may be updated. The update may be programmed via an interface port, such as maintenance interface port 219 of FIG. 2. The algorithmic based approach can help reduce power and area by multiplexing the use of common circuit blocks.

Figure 3:
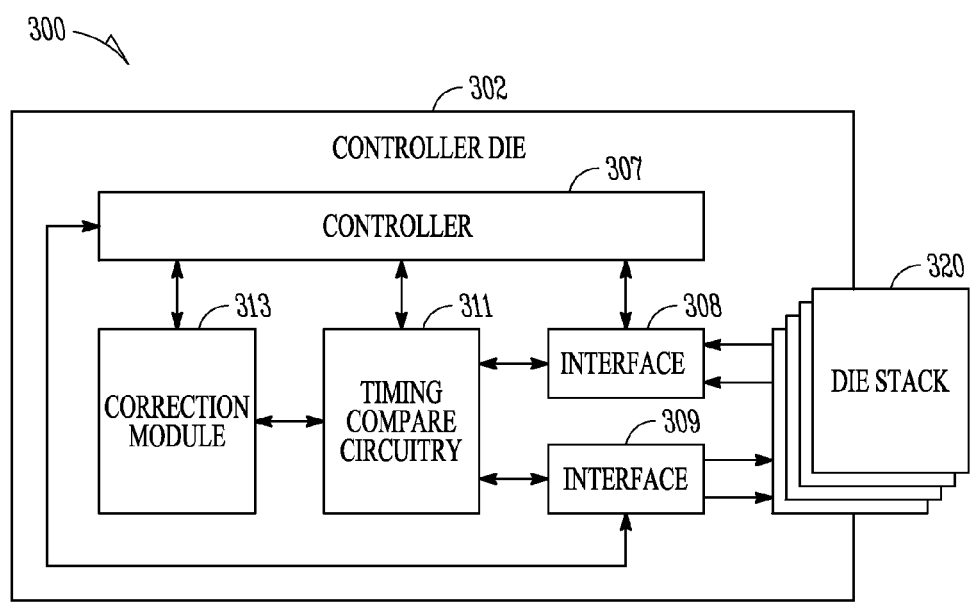
FIG. 3 is a block diagram of an example apparatus operable to track and correct a timing signal, according to various embodiments.

FIG. 3 is a block diagram of an embodiment of an example apparatus 300 operable to track and correct a timing signal. Apparatus 300 can be structured to be operable to track and correct a duty cycle and/or a reference voltage setting. Apparatus 300 can include an interface 309, timing compare circuitry 311, a correction module 313, and a controller 307 on a controller die 302. Controller die 302 can be a logic die, also referred to as a logic chip by those of ordinary skill in the art, that controls access to and from one or more dies 320. Interface 309 can be arranged to transmit signals to one or more dies 320. Such signals can include a clock signal, a strobe signal, a data signal, an address signal, command signals, or other type of signals according to the arrangement and/or application of interface 309 with the one of more dies 320. Interface 309 can be configured as a clock/data interface. Apparatus 300 can include an interface 308, which can be structured to receive signals from one or more dies 320. The received signals can be the result of operations in the one or more dies 320 taken in response to transmitted signals to the one or more dies 320. The received signals can be a signal, such as a clock signal or a strobe signal, transmitted from interface 309 and returned to interface 308 with a timing shift relative to the signal transmitted. The interface 308 may be integrated with interface 309 or may be a separate component.

The one or more dies 320 can be arranged as a stack of dies. The stack of dies can be disposed vertically above or below controller die 302. An example of such an arrangement with a stack of dies disposed vertically above a logic die is a HMC. The one or more dies 320 can be arranged in a horizontal plane.

Timing compare circuitry 311 can be structured to compare the clock signal or the strobe signal transmitted from interface 309 to a respective return clock signal or return strobe signal to interface 308 and to provide a timing delta from the comparison. The timing compare circuitry 311 can be configured with logic components to compare the timing of the transmitted and returned signals. Output from the comparison can be provided to correction module 313.

Correction module 313 can be structured to calculate a correction value to adjust a subsequent clock signal or to adjust a reference voltage setting associated with a subsequent strobe signal. The calculation can be based on voltage shift data derived from the timing delta provided by timing compare circuitry 311. Correction module 313 can include a duty cycle algorithm that calculates the duty cycle correction value. The duty cycle section can be a hardware or software-based algorithm. Correction module 313 can include comparison circuitry to generate the correction value. Correction module 313 can include codes structured in firmware to generate the correction value. The correction value to adjust a subsequent clock signal can include a value to pre-skew the subsequent clock signal. For example, if a return signal has a 55% duty cycle, where the return signal is from a signal that was transmitted with a 50% duty cycle, rather than launch the subsequent signal with a 50% duty cycle, the subsequent signal can be launched with a 45% duty cycle knowing the amount of corruption to the transmitted signal is a positive 5%. The duty cycle for the subsequent signal can be increased if the measurement on the return signal indicates that the corruption is in the negative direction. The procedure can be applied to a clock signal or a strobe signal. This approach can also be applied to a traditional part to part connection across a printed circuit board system as well as die stack configurations. The interface, the timing compare circuitry, the correction module, and the controller can be disposed in a process control block to apply the correction value to a part to part connection.

Controller 307 can be structured to apply the correction value from correction module 313 to the subsequent clock signal or the reference voltage setting transmitted from interface 309 to one or more dies 320. Controller 307 can be realized in hardware as an interface controller.

In various embodiments, an apparatus, such as apparatus 300, can comprise a plurality of memory dies and a logic die coupled to the plurality of memory dies. The plurality of memory dies may be configured as one or more dies 320 and the logic die can be configured as controller die 302. Logic die can include an interface, such as interface 309, arranged to transmit a clock signal, a strobe signal, or both a clock signal and a strobe signal to a selected memory die of the plurality of memory dies; timing compare circuitry, such as timing compare circuitry 311, structured to compare the clock signal or the strobe signal to a respective return clock signal or return strobe signal from the selected memory die and to provide a timing delta from the comparison; a correction module, such as correction module 313, structured to calculate a correction value to adjust a subsequent clock signal to the selected memory die or to adjust a reference voltage setting associated with a subsequent strobe signal to the selected memory die, the calculation based on voltage shift data derived from the timing delta; and a controller to apply the correction value to the subsequent clock signal or the reference voltage setting. The interface, the timing compare circuitry, the correction module, and the controller can be implemented similar to or identical to interface 309, timing compare circuitry 311, correction module 313, and controller 307, respectively.

The plurality of memory dies can be arranged in a vertical stack. The vertical stack may be disposed on or below the logic die. The vertical stack may be configured separate from the logic die such that the vertical stack is not disposed on or below the logic die. The vertical stack may be disposed adjacent the logic die.

The correction module can include firmware having instructions to determine a ratio of timing steps to reference voltage steps, to determine a ratio of timing steps to duty cycle control steps, or to determine both a ratio of timing steps to reference voltage steps and a ratio of timing steps to duty cycle control steps. The correction module can include firmware having routines to validate correction values over the life of a selected memory die of the plurality of memory dies. The correction value can be positive or a negative based on timing to duty cycle ratio for interfacing with a selected die.

In various embodiments, an apparatus comprises a first die having a first voltage domain; a second die having a second voltage domain, the second voltage domain independent of the first voltage domain; an interface arranged to transmit a timing signal from the first die to the second die; timing compare circuitry structured to compare the timing signal to a return timing signal from the second die and to provide a timing delta from the comparison; a correction module structured to calculate a correction value to adjust a subsequent timing signal from the first die to the second die or to adjust a reference voltage setting associated with the timing signal, the calculation based on voltage shift data derived from the timing delta; and a controller to apply the correction value to the subsequent clock signal or the reference voltage setting. The timing signal can include a clock signal, a strobe signal, or both a clock signal and a strobe signal. The interface, the timing compare circuitry, the correction module, and the controller can be implemented similar to or identical to interface 309, timing compare circuitry 311, correction module 313, and controller 307, respectively. The interface, the timing compare circuitry, the correction module, and the controller can be disposed in a controller die operatively coupled to the first die and the second die. The interface, the timing compare circuitry, the correction module, and the controller can be disposed in the first die. The second die can be structured to contain an interface, timing compare circuitry, a correction module, and a controller similar to such components configured in the first die such that the second die can operate as a source die. With the second die operating as a source die, the first die can operate as a destination die.

The timing compare circuitry can include tracking circuitry arranged to use a return read strobe to track. The correction module can be arranged to monitor a timing delta, to track accumulation of timing deltas, and to compare the accumulation to a threshold to calculate the correction value. The apparatus can include stored instructions to translate the timing delta into an offset to apply to a duty cycle of a source die such as the first die.

Figure 4:
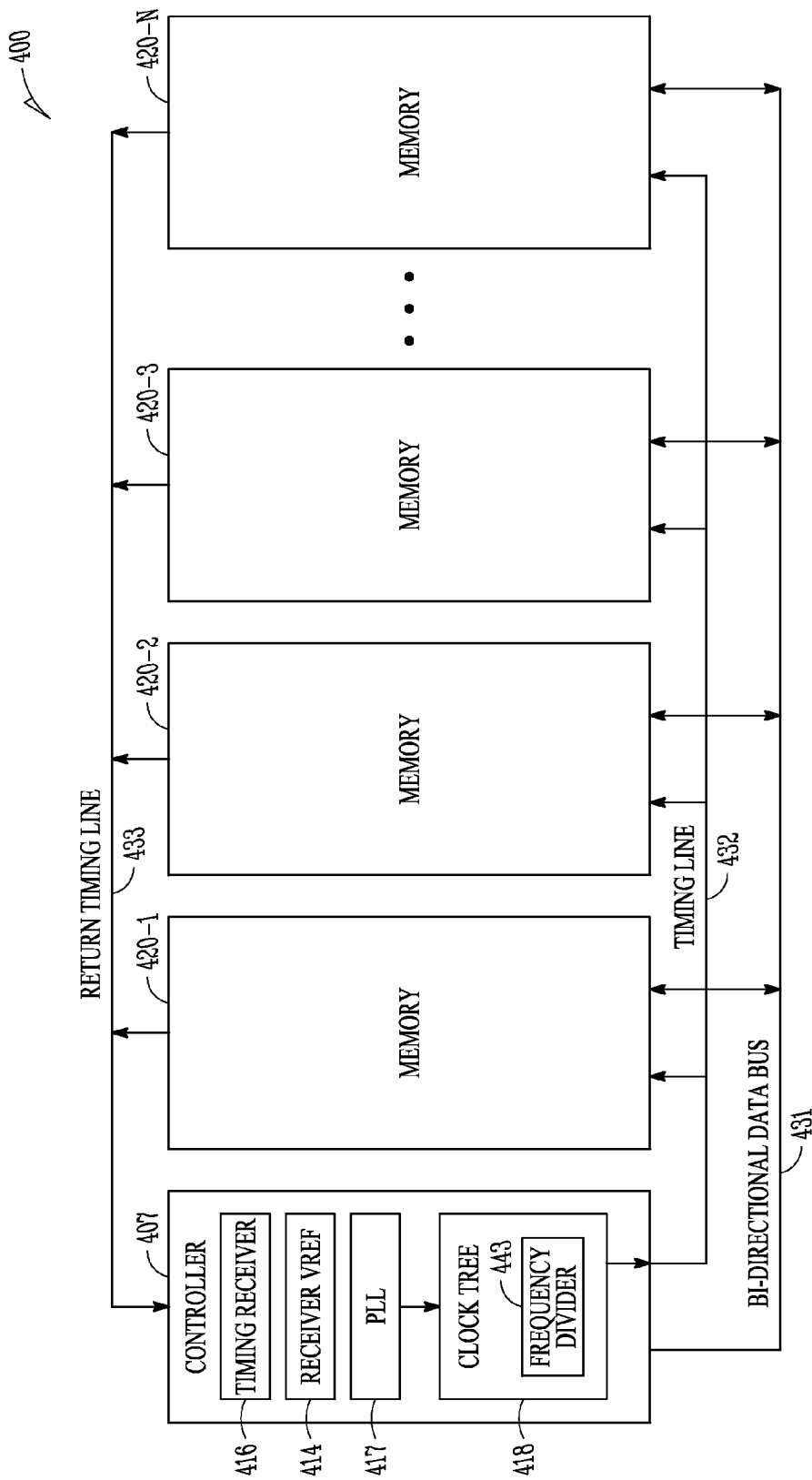
FIG. 4 is a block diagram of an example apparatus operable to track and correct a timing signal, according to various embodiments.

FIG. 4 is a block diagram of an embodiment of an example apparatus 400 operable to track and correct a duty cycle and/or a reference voltage setting. Apparatus 400 can include a controller die 407, memory dies 420-1 . . . 420-N, bi-directional data bus 431, timing line 432, and return timing line 433. Timing line 432 can include one or more communication paths for a strobe, a clock, or combinations thereof. Timing line 433 can include one or more communication paths for a return strobe, a return clock, or combinations thereof. Controller die 407 can include an interface to generate the clock and/or strobe, an interface to receive the clock and/or returned to the controller die, timing compare circuitry, and a correction module, structured in a manner similar to, identical to, or an integrated form of controller die 302 of FIG. 3. Controller die 402 can include a receiver VREF 416, a timing receiver 416, a PLL 417, and a clock tree 418. Timing receiver 416 can be structured as a clock receiver, a strobe receiver, or a combination thereof. Clock tree 418 may be implemented with a frequency divider 443.

An outgoing strobe or clock can be directed from controller 407 to a memory die 420-J (1<J<N) on timing line 432. Memory die 420-J can be arranged in a stack with the other memory dies. The outgoing strobe or clock can be directed from controller 407 can also be to parts on a board and not restricted to stacked parts only. In addition, memory dies 420-1 . . . 420-N may be arranged in a horizontal relationship or a combination of horizontally and vertically oriented memory dies.

A return strobe or return clock from each memory die of memory dies 420-1 . . . 420-N back to the controller 407 on return timing line 433 can be used for calculations as discussed herein to make adjustments associated with timing. The outgoing strobe or clock can be one signal from controller 407 to each unique memory die of memory dies 420-1 . . . 420-N or a single shared signal going from controller 407 to all memory dies 420-1 . . . 420-N. The clock/strobe signal is generated on the controller 407 and sent to the selected memory die(s). The return clock/strobe signal is a delayed version of the clock/strobe signal sent to the selected memory die(s) that is sent back for tracking. From the tracking, a clock signal may be pre-skewed and/or adjustments can be made to receiver VREF 414. Apparatus 400 may be structured to appropriately include features from and/or operate similar or identical to apparatus associated with FIGS. 1-3.

Figure 5:
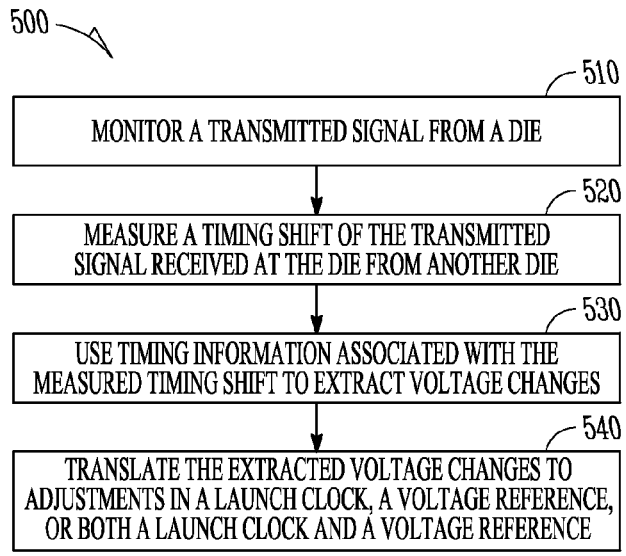
FIG. 5 shows features of an example method to track and/or correct timing signals, according to various embodiments.

FIG. 5 shows features of an embodiment of a method 500 to track and/or correct timing signals. Method 500 may be implemented by one or more apparatus associated with any of FIGS. 1-4. At 510, a transmitted signal from a die is monitored. The monitoring can include monitoring the timing of the transmitted signal being transmitted from the die to another die. At 520, a timing shift of the transmitted signal received at the die from the other die is measured. For the die and the other die having different, independent voltage domains a signal sent from the die to the other die and returned to the die from the other die can have timing shifts. If the timing shifts are greater than a selected threshold, the timing to a subsequent version of the signal can be adjusted in the die before being transmitted to the other die.

At 530, timing information associated with the measured timing shift is used to extract voltage changes. At 540, the extracted voltage changes are translated to adjustments in a launch clock, a voltage reference, or both a launch clock and a voltage reference.

Translating the extracted voltage changes to adjustments in a launch clock can include adjusting a duty cycle of the launch clock. Translating the extracted voltage changes can include using inferred voltage shift information derived from the measured time shift to adjust programmable duty cycle control circuits of the die. Translating the extracted voltage changes can include using a function derived through one or more of simulation, lab measurement, or production testing. Using the function can include determining a ratio of timing steps to reference steps, a ratio of timing steps to duty cycle control steps, or both a ratio of timing steps to reference steps and a ratio of timing steps to duty cycle control steps. Using the function includes accessing the function from storage in the die.

Method 500 or methods similar to method 500 can include monitoring the launch clock, having the adjusted duty cycle, transmitted from the die and measuring a timing shift of the launch clock received at the die from the other die to verify that the adjustment is within a selected range. Method 500 or methods similar to method 500 can include iteratively tracking and determining whether a measured timing shift is within an error range to maintain a selected amount of duty cycle error. The selected amount of duty cycle error may approximate a minimum duty cycle error.

Figure 6:
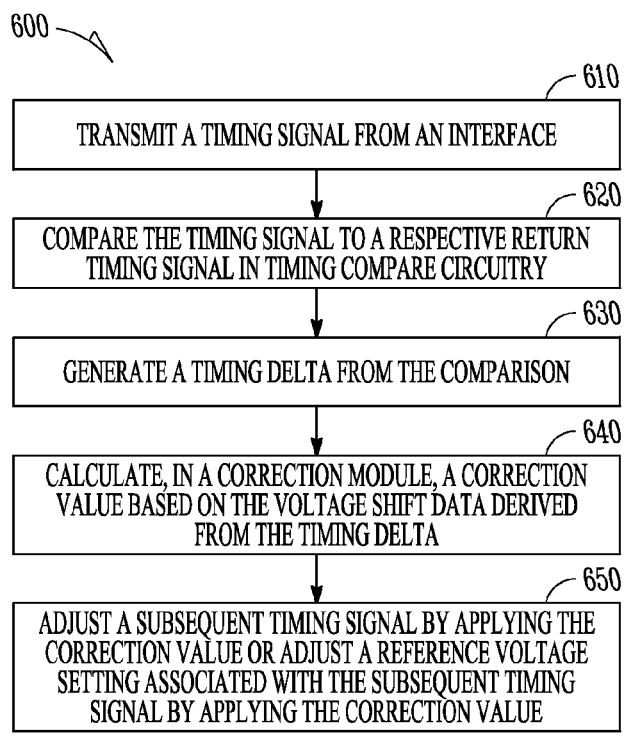
FIG. 6 shows features of an example method to track and/or correct timing signals, according to various embodiments.

FIG. 6 shows features of an embodiment of a method 600 to track and/or correct timing signals. Method 600 may be implemented by one or more apparatus associated with any of FIGS. 1-4. At 610, a timing signal is transmitted from an interface. The timing signal can include a clock signal, a strobe signal, or both a clock signal and a strobe signal. At 620, the timing signal is compared to a return timing signal in timing compare circuitry. The return signal is the transmitted timing signal delayed by propagation through and returned from another device. The transmitting and the comparing can include using a read strobe and a return read strobe with respect to a memory device. At 630, a timing delta is generated from the comparison.

At 640, in a correction module, a correction value is calculated based on voltage shift data derived from the timing delta. Calculating the correction value can include executing codes stored in a firmware structure to generate the correction value. At 650, a subsequent timing signal is adjusted by applying the correction value or a reference voltage setting associated with the timing signal is adjusted by applying the correction value. The subsequent timing signal may be a subsequent clock signal or a subsequent strobe signal. Adjusting the subsequent clock signal can include pre-skewing the subsequent clock signal. The transmitting, the comparing, the generating, the calculating, and the adjusting can be performed in a controller die coupled to a die stack, the die stack having a plurality of dies.

Figure 7:
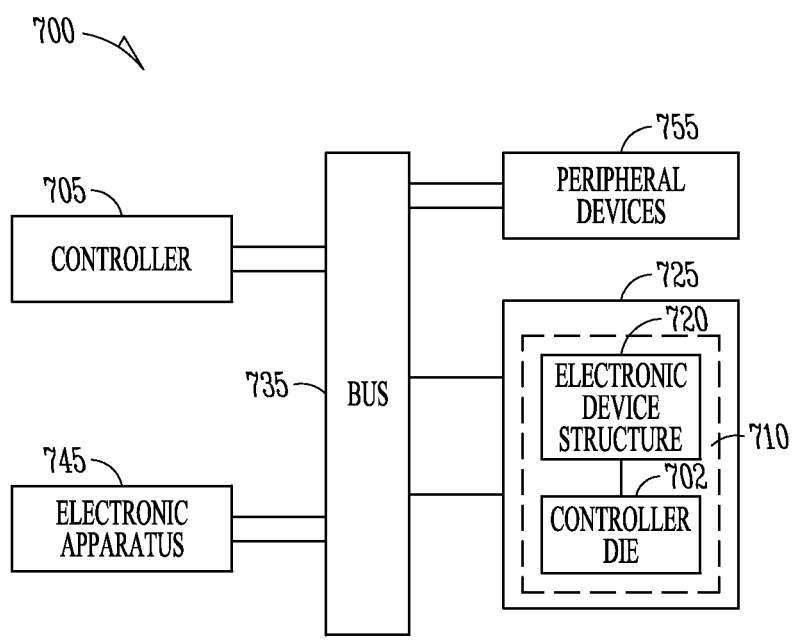
FIG. 7 shows a block diagram of features of an example electronic system, according to various embodiments.

FIG. 7 shows a block diagram of various features of an example embodiment of electronic system 700, according to the teachings herein. System 700 can include a controller 705, an apparatus 725 having an integrated device 710 including a controller die 702 coupled to a stack 720 of dies. Stack 720 of dies can be a stack of memory dies. Integrated device 710 including controller die 702 coupled to stack 720 can be structured and operated in a manner similar to or identical to one or more embodiments discussed with respect to FIGS. 1-6.

System 700 may be formed in various ways such as coupling the individual components of system 700 together or integrating the components into one or a number of die-based units using conventional techniques. In an embodiment, system 700 also includes an electronic apparatus 745 and a bus 735, where bus 735 provides electrical conductivity between controller 705 and electronic apparatus 745 and between controller 705 and apparatus 725. In an embodiment, bus 735 includes an address bus, a data bus, and a control bus, each independently configured. In an alternative embodiment, bus 735 uses common conductive lines for providing one or more of address, data, or control, the use of which is regulated by controller 705. In an embodiment, electronic apparatus 745 may include memory for the intended functional applications of electronic system 700.

With integrated device 710 arranged as a stack 720 of memory dies, the types of memory dies may include, but are not limited to, dynamic random access memory, static random access memory, synchronous dynamic random access memory (SDRAM), synchronous graphics random access memory (SGRAM), double data rate dynamic ram (DDR), and double data rate SDRAM, arranged according to the various embodiments as taught herein. Structures of various embodiments of apparatus 725 having memory device 710 including logic die 702 coupled with stack 720 of memory dies, in accordance with various embodiments as illustrated in FIGS. 1-6, may be realized in simulation packages that may be arranged as software, hardware, or a combination of software and hardware packages to simulate various embodiments and/or the operation of various embodiments.

In various embodiments, peripheral device or devices 755 can be coupled to bus 735. Peripheral devices 755 may include displays, imaging devices, printing devices, wireless devices, wireless interfaces (e.g. wireless transceivers), additional storage memory, control devices that may operate in conjunction with controller 705. In an embodiment, controller 705 can include one or more processors. In various embodiments, system 700 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. An apparatus comprising:
an interface to transmit a timing signal to a plurality of dies, at least one of the dies having a voltage domain different from other dies of the plurality;
timing compare circuitry to compare the timing signal to a return timing signal and to provide a timing delta from the comparison;
a correction module to calculate one or more correction values to adjust a subsequent timing signal, a reference voltage setting associated with the timing signal, or both a subsequent timing signal and a reference voltage setting associated with the timing signal, the calculation based on voltage shift data derived from the timing delta and based on one or more ratios from a group of ratios including a ratio of timing steps to reference steps, a ratio of timing steps to duty cycle control steps, and both a ratio of timing steps to reference steps and a ratio of timing steps to duty cycle control steps, the voltage shift data including approximate voltage change due to the respective voltage domain differences; and
a controller to apply the one or more correction values to the subsequent timing signal, the reference voltage setting, or both the subsequent timing signal and the reference voltage setting.

2. The apparatus of claim 1, wherein the timing signal includes a clock signal, a strobe signal, or both a clock signal and a strobe signal and the subsequent timing signal comprises a subsequent clock signal, a subsequent strobe signal, or both a subsequent clock signal and a subsequent strobe signal.

3. The apparatus of claim 2, wherein the correction value to adjust a subsequent clock signal includes a value to pre-skew the subsequent clock signal.

4. The apparatus of claim 1, wherein the interface, the timing compare circuitry, the correction module, and the controller are disposed in a controller die coupled to a die stack, the die stack having the plurality of dies.

5. The apparatus of claim 1, wherein the interface, the timing compare circuitry, the correction module, and the controller are disposed in a process control block to apply the correction value to a part to part connection.

6. An apparatus comprising:
an interface to transmit a timing signal;
timing compare circuitry to compare the timing signal to a return timing signal and to provide a timing delta from the comparison;
a correction module to calculate a correction value to adjust a subsequent timing signal or to adjust a reference voltage setting associated with the timing signal, the calculation based on voltage shift data derived from the timing delta; and
a controller to apply the correction value to the subsequent timing signal or to the reference voltage setting, wherein the correction module includes comparison circuitry to generate the correction value.

7. An apparatus comprising:
an interface to transmit a timing signal;
timing compare circuitry to compare the timing signal to a return timing signal and to provide a timing delta from the comparison;
a correction module to calculate a correction value to adjust a subsequent timing signal or to adjust a reference voltage setting associated with the timing signal, the calculation based on voltage shift data derived from the timing delta; and
a controller to apply the correction value to the subsequent timing signal or to the reference voltage setting, wherein the correction module includes firmware code structures in firmware to generate the correction value.

8. An apparatus comprising:
a first die having a first voltage domain;
a second die having a second voltage domain, the second voltage domain independent of the first voltage domain;
an interface to transmit a timing signal from the first die to the second die;
timing compare circuitry to compare the timing signal to a return timing signal from the second die and to provide a timing delta from the comparison;
a correction module to calculate one or more Hall correction values to adjust a subsequent timing signal from the first die to the second die, a reference voltage setting associated with the timing signal, or both a subsequent timing signal from the first die to the second die and a reference voltage setting associated with the timing signal, the calculation based on voltage shift data derived from the timing delta and based on one or more ratios from a group of ratios including a ratio of timing steps to reference steps, a ratio of timing steps to duty cycle control steps, and both a ratio of timing steps to reference steps and a ratio of timing steps to duty cycle control steps, the voltage shift data including approximate voltage change due to the respective voltage domain differences; and
a controller to apply the one or more correction values to the subsequent timing signal, the reference voltage setting, or both the subsequent timing signal and the reference voltage setting.

9. The apparatus of claim 8, wherein the interface, the timing compare circuitry, the correction module, and the controller are disposed in a controller die operatively coupled to the first die and the second die.

10. An apparatus comprising:
a first die having a first voltage domain;
a second die having a second voltage domain, the second voltage domain independent of the first voltage domain;
an interface to transmit a timing signal from the first die to the second die;
timing compare circuitry to compare the timing signal to a return timing signal from the second die and to provide a timing delta from the comparison;
a correction module to calculate a correction value to adjust a subsequent timing signal from the first die to the second die or to adjust a reference voltage setting associated with the timing signal, the calculation based on voltage shift data derived from the timing delta; and
a controller to apply the correction value to the subsequent timing signal or the reference voltage setting, wherein the timing compare circuitry includes tracking circuitry to use a return read strobe to track.

11. An apparatus comprising:
a first die having a first voltage domain;
a second die having a second voltage domain, the second voltage domain independent of the first voltage domain;
an interface to transmit a timing signal from the first die to the second die;
timing compare circuitry to compare the timing signal to a return timing signal from the second die and to provide a timing delta from the comparison;
a correction module to calculate a correction value to adjust a subsequent timing signal from the first die to the second die or to adjust a reference voltage setting associated with the timing signal, the calculation based on voltage shift data derived from the timing delta; and
a controller to apply the correction value to the subsequent timing signal or the reference voltage setting, wherein the correction module is arranged to monitor the timing delta, to track accumulation of timing delta, and to compare the accumulation to a threshold to calculate the correction value.

12. An apparatus comprising:
a first die having a first voltage domain;
a second die having a second voltage domain, the second voltage domain independent of the first voltage domain;
an interface to transmit a timing signal from the first die to the second die;
timing compare circuitry to compare the timing signal to a return timing signal from the second die and to provide a timing delta from the comparison;
a correction module to calculate a correction value to adjust a subsequent timing signal from the first die to the second die or to adjust a reference voltage setting associated with the timing signal, the calculation based on voltage shift data derived from the timing delta; and
a controller to apply the correction value to the subsequent timing signal or the reference voltage setting, wherein the apparatus includes stored instructions to translate the timing delta into an offset to apply to a duty cycle of the first die.

13. A method comprising:

transmitting a timing signal from an interface to a plurality of dies, at least one of the dies having a voltage domain different from other dies of the plurality;

comparing, using timing compare circuitry, the timing signal to a return timing signal in timing compare circuitry;

generating, using the timing compare circuitry, a timing delta from the comparison;

calculating, in a correction module, a correction value one or more correction values to adjust a subsequent timing signal, a reference voltage setting associated with the timing signal, or both a subsequent timing signal and a reference voltage setting associated with the timing signal, the correction value based on voltage shift data derived from the timing delta and based on one or more ratios from a group of ratios including a ratio of timing steps to reference steps, a ratio of timing steps to duty cycle control steps, and both a ratio of timing steps to reference steps and a ratio of timing steps to duty cycle control steps, the voltage shift data including approximate voltage change due to the respective voltage domain differences; and adjusting the subsequent timing signal, the reference voltage setting, or both the subsequent timing signal and the reference voltage setting by applying the one or more correction values using a controller.

14. The method of claim 13, wherein transmitting the timing signal includes transmitting a clock signal, a strobe signal, or both a clock signal and a strobe signal and adjusting the subsequent timing signal includes adjusting a subsequent clock signal, a subsequent strobe signal, or both a subsequent clock signal and a subsequent strobe signal.

15. The method of claim 14, wherein adjusting the subsequent clock signal includes pre-skewing the subsequent clock signal.

16. The method of claim 13, wherein the transmitting, the comparing, the generating, the calculating, and the adjusting are performed in a controller die coupled to a die stack, the die stack having a plurality of dies.

17. The method of claim 13, wherein calculating the correction value includes executing codes stored in a firmware structure to generate the correction value.

18. The method of claim 13, wherein the transmitting and the comparing include using a read strobe and a return read strobe.

* * * * *